United States Patent
Koba et al.

(10) Patent No.: US 9,880,225 B2
(45) Date of Patent: Jan. 30, 2018

(54) BATTERY STATE DETERMINATION DEVICE

(71) Applicants: PRIMEARTH EV ENERGY CO., LTD., Kosai-shi, Shizuoka (JP); TOYOTA JIDOSHA KABUSHIKI KAISHA, Toyota-shi, Aichi-ken (JP)

(72) Inventors: Daisuke Koba, Toyohashi (JP); Sachio Takeda, Toyohashi (JP); Koichi Ichikawa, Kasugai (JP); Yasuhiro Takahashi, Miyoshi (JP); Masahiko Mitsui, Toyota (JP)

(73) Assignee: PRIMEARTH EV ENERGY CO., LTD., Toyota-Shi (JP)

( * ) Notice: Subject to any disclaimer, the term of this patent is extended or adjusted under 35 U.S.C. 154(b) by 135 days.

(21) Appl. No.: 14/782,778

(22) PCT Filed: Mar. 13, 2014

(86) PCT No.: PCT/JP2014/056681
§ 371 (c)(1),
(2) Date: Oct. 6, 2015

(87) PCT Pub. No.: WO2014/167936
PCT Pub. Date: Oct. 16, 2014

(65) Prior Publication Data
US 2016/0054389 A1 Feb. 25, 2016

(30) Foreign Application Priority Data

Apr. 12, 2013 (JP) ................. 2013-083788

(51) Int. Cl.
*G01N 27/416* (2006.01)
*H02J 7/04* (2006.01)
(Continued)

(52) U.S. Cl.
CPC ......... *G01R 31/3624* (2013.01); *G01R 31/02* (2013.01); *G01R 31/36* (2013.01);
(Continued)

(58) Field of Classification Search
CPC .................................................. G01R 31/3624
(Continued)

(56) References Cited

U.S. PATENT DOCUMENTS

| | | |
|---|---|---|
| 5,945,805 A | 8/1999 | Takei et al. |
| 2006/0186859 A1 | 8/2006 | Fujikawa et al. |

(Continued)

FOREIGN PATENT DOCUMENTS

| | | |
|---|---|---|
| CN | 1174441 A | 2/1998 |
| CN | 102144171 A | 8/2011 |

(Continued)

OTHER PUBLICATIONS

CN First Office Action dated Mar. 20, 2017 as received in Application No. 201480017294.7 (English Translation).

*Primary Examiner* — Edward Tso
*Assistant Examiner* — Ahmed Omar
(74) *Attorney, Agent, or Firm* — Maschoff Brennan

(57) ABSTRACT

This battery state determination device (10) is provided with: a voltage detection unit (13) that detects the voltage (V) of a rechargeable battery (M) to be evaluated; a current detection unit (12) that detects the current of the rechargeable battery (M); a charge state detection unit (11) that detects the state of charge (SOC) of the rechargeable battery (M); and a determination unit (11) configured so as to calculate the absolute value of the voltage gradient (G), which indicates the change in voltage with respect to the discharge amount (Ah), when the state of charge (SOC) of the rechargeable battery (M) is less than 40%, compare the absolute value of the voltage gradient (G) to a pre-set upper
(Continued)

limit value (Gmax), and, when the absolute value of the voltage gradient (G) is greater than the upper limit value (Gmax), determine that a small short circuit has occurred in the rechargeable battery (M).

4 Claims, 2 Drawing Sheets

(51) Int. Cl.
| | |
|---|---|
| *H02J 7/16* | (2006.01) |
| *G01R 31/36* | (2006.01) |
| *H01M 10/48* | (2006.01) |
| *H01M 10/44* | (2006.01) |
| *H02J 7/00* | (2006.01) |
| *G01R 31/02* | (2006.01) |
| *G01R 19/12* | (2006.01) |

(52) U.S. Cl.
CPC ........ *G01R 31/3648* (2013.01); *H01M 10/44* (2013.01); *H01M 10/48* (2013.01); *H02J 7/0047* (2013.01); *G01R 19/12* (2013.01); *G01R 31/025* (2013.01); *H02J 2007/005* (2013.01)

(58) Field of Classification Search
USPC ........................................................ 324/426
See application file for complete search history.

(56) References Cited

U.S. PATENT DOCUMENTS

| | | |
|---|---|---|
| 2010/0194398 A1 | 8/2010 | Kawasumi et al. |
| 2011/0187329 A1* | 8/2011 | Majima .................. G01R 31/36 320/149 |

FOREIGN PATENT DOCUMENTS

| | | |
|---|---|---|
| JP | 11-144769 A | 5/1999 |
| JP | 2006-258797 A | 9/2006 |
| JP | 2010-181262 A | 8/2010 |
| JP | 2010-218976 A | 9/2010 |

\* cited by examiner

BATTERY STATE DETERMINATION DEVICE

TECHNICAL FIELD

The present invention relates to a battery state determination device that determines whether or not a micro-short circuit has occurred in a rechargeable battery.

BACKGROUND ART

To detect abnormality, such as deterioration, of a rechargeable battery, a known method determines whether or not an abnormality exists based on voltage changes during charging or discharging. This method allows the state of the battery to be evaluated without damaging the battery. Thus, the rechargeable battery may be reused when determined as being normal.

As a method for detecting an abnormal state based on the voltage of a rechargeable battery, Patent Document 1 discloses a method for comparing the battery voltage with a predetermined value when the depth of discharge of an assembled battery is 0% to 60%. It is an object of the method to detect an abnormality such as liquid depletion in the battery. The method measures the voltage for each block of the assembled battery when the depth of discharge of the assembled battery is 0% to 60%. When the voltage is less than or equal to a predetermined value, it is determined that an abnormality has occurred. The voltage used for the determination is measured when the depth of discharge is 0% to 60%, that is, when the state of charge is 40% to 100%. This is because the voltage becomes low in the final stage of discharging even in a normal battery. Thus, non-defective products are difficult to distinguish from defective products when referring to only the voltage.

PRIOR ART DOCUMENT

Patent Document

Patent Document 1: Japanese Laid-Open Patent Publication No. 11-144769

SUMMARY OF THE INVENTION

Problems that are to be Solved by the Invention

However, the inventors of the present invention have learned through experiments that the determination accuracy decreases when screening rechargeable batteries having micro-short circuits based on only the voltage measured when the depth of discharge is 0% to 60%. For example, when determined through the above method that the voltage of a rechargeable battery indicates a normal value, another test may indicate that a micro-short circuit has occurred in the rechargeable battery. Thus, there is a demand for a method that accurately determines the occurrence of a micro-short circuit in a rechargeable battery.

It is an object of the present invention to improve the determination accuracy of a battery state determination device that determines whether or not a micro-short circuit has occurred.

Means for Solving the Problem

One aspect of a battery state determination device according to the present invention includes a voltage detector that detects a voltage value of a rechargeable battery that is subject to determination, a current detector that detects a current value of the rechargeable battery, a charge state detector that detects a state of charge of the rechargeable battery, and a determination unit configured to calculate an absolute value of a voltage gradient that indicates a voltage change amount relative to a discharge amount when a state of charge of the rechargeable battery is less than 40%, compare the absolute value of the voltage gradient with a predetermined upper limit value, and determine that a micro-short circuit has occurred in the rechargeable battery when the absolute value of the voltage gradient is larger than the upper limit value.

EMBODIMENTS OF THE INVENTION

First Embodiment

A first embodiment of a battery state determination device will now be described. The device and method determines whether or not a rechargeable battery such as a lithium ion battery or a nickel metal hydride battery is in a state in which a micro-short circuit has occurred (micro-short circuit state). A micro-short circuit is caused by, for example, fine precipitates or microscopic foreign matters that enter the battery. A micro-short circuit would not immediately disable use of a battery. When a micro-current flows through a location that is short-circuited due to a micro-short circuit, the short-circuited location may be instantaneously burned. Further, a micro-short circuit may lower the battery capacity or lead to internal short-circuiting.

Figure 1:
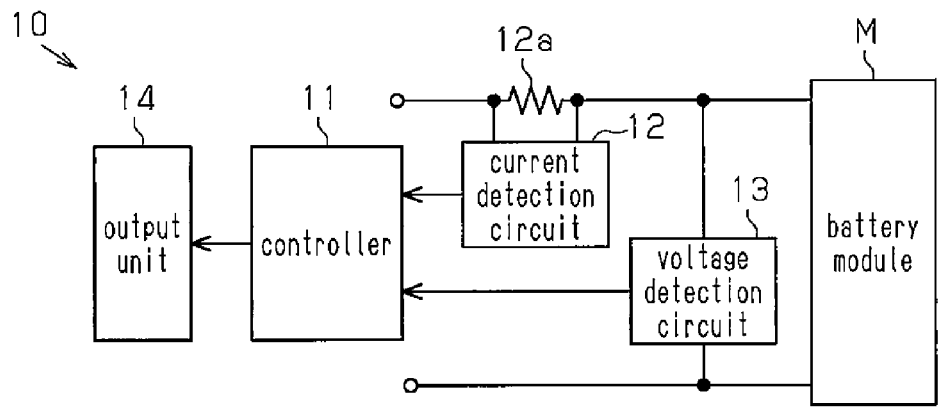
FIG. 1 is a schematic diagram showing a first embodiment of a device and method that determines a battery state according to the present invention.

As shown in FIG. 1, a battery state determination device 10 includes a controller 11, a current detection circuit 12, and a voltage detection circuit 13. The current detection circuit 12 measures the value of current that flows through a detection resistor 12a, which is connected in series to a battery module M, and outputs the current value to the controller 11. The voltage detection circuit 13 measures the voltage across the two ends of the battery module M and outputs the voltage value to the controller 11.

In the present embodiment, the battery module M includes a plurality of battery cells. A plurality of battery modules M is combined to form a battery stack. The battery stack, an ECU, and the like form a battery pack, which is installed in a vehicle, for example. In the present embodiment, the controller 11 connects the battery module M to a charger (not shown) when the SOC is "0" (non-charged state).

The controller 11 includes, for example, a CPU, a RAM, and a ROM. The controller 11 outputs a determination result to an output unit 14, which includes a display, a printing device, or the like. Further, the controller 11 cumulates the current values output from the current detection circuit 12 to obtain the state of charge (SOC) of the battery module M. When the SOC of the battery module M reaches a predetermined value that is less than 40%, the controller 11 disconnects the battery module M from the charger to stop charging. In the present embodiment, the predetermined value of the SOC is set to 10%.

When the battery module M is disconnected from the charger, the controller 11 calculates a discharge amount based on the current value that is output from the current detection circuit 12. The controller 11 associates the voltage value output from the voltage detection circuit 13 with the discharge amount and stores the voltage value in a memory (not shown). The controller 11 obtains a discharge amount and a voltage change amount from when the SOC is 10% to when the SOC becomes 0%, that is, until the SOC reaches a discharge termination voltage. Further, the controller 11 obtains a voltage gradient G (V/Ah), which indicates the voltage change amount relative to the discharge amount. The obtained voltage gradient G is a negative value.

Figure 2:
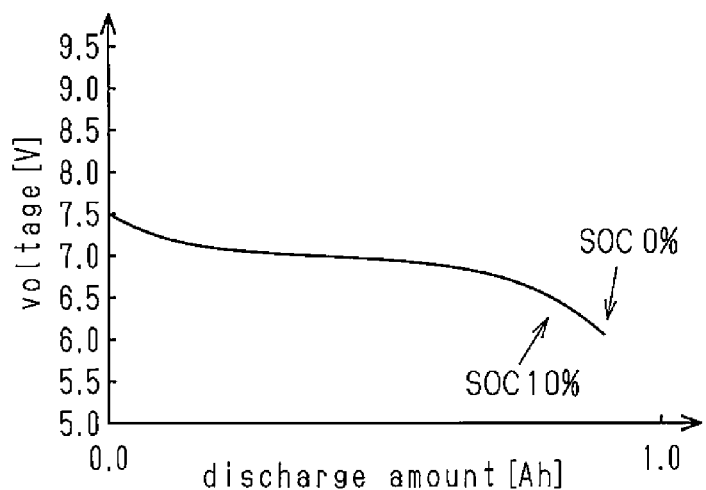
FIG. 2 is a graph showing voltage changes relative to a discharge amount in a non-defective battery module.

FIG. 2 is a graph showing a discharge curve of a non-defective battery module M, which is not in a micro-short circuit state. In FIG. 2, the horizontal axis represents the discharge amount (Ah) and the vertical axis represents the voltage (V). Further, the curve shown in the graph is plotted from when the SOC is 100% to when the SOC falls to 0% as a result of discharging. When the battery module M undergoes discharging, the battery voltage gradually decreases. As the SOC approaches 10%, the value (absolute value) of the voltage gradient G increases and changes. When the SOC reaches 10%, the voltage gradient G becomes substantially constant.

Figure 3:
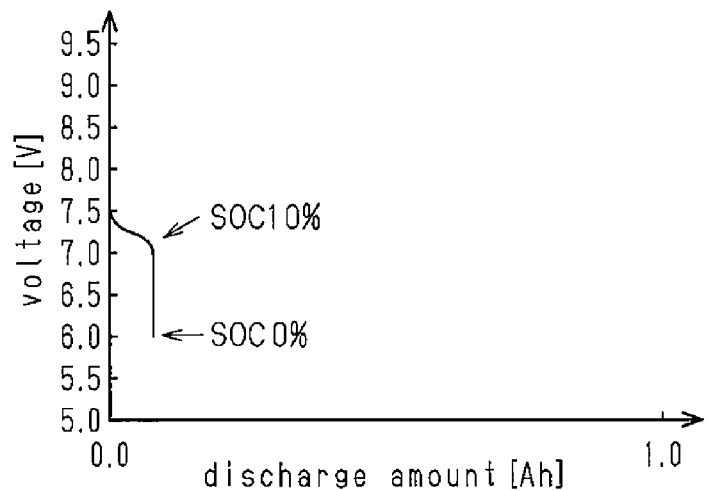
FIG. 3 is a graph showing voltage changes relative to a discharge amount in a defective battery module.

FIG. 3 is a graph showing a discharge curve of a battery module M that is in a micro-short circuit state. The curve is plotted from when the SOC is 100% to when the SOC falls to 0% as a result of discharging. As the battery module M undergoes discharging, the battery voltage rapidly decreases. The absolute value of the voltage gradient G in this case is larger than that of the non-defective battery module M. When the SOC reaches 10%, the voltage gradient G is substantially constant. However, the absolute value of the voltage gradient G is much higher than that of a non-defective product.

Figure 4:
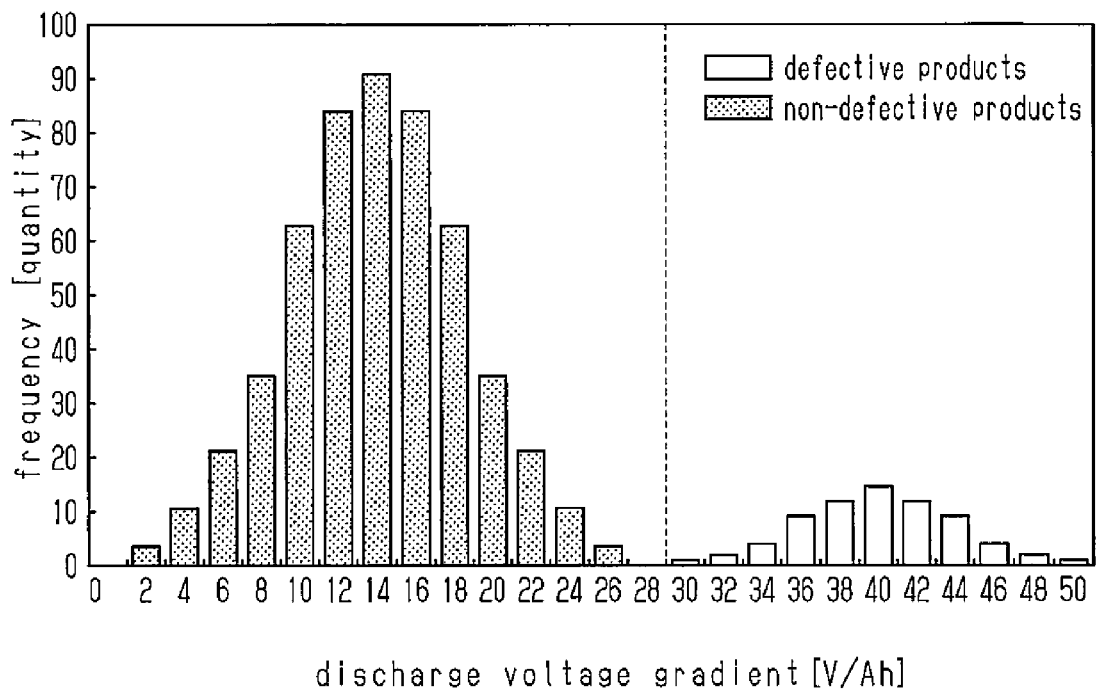
FIG. 4 is a distribution chart showing the relationship of distribution and voltage gradient of non-defective products and defective products that are used for determination in the first embodiment.

FIG. 4 is a distribution chart showing the correlation of the voltage gradient G and a micro-short circuit state when the SOC is greater than or equal to 0 and less than or equal to 10%. In FIG. 4, several hundred battery modules M are subject to determination. The horizontal axis represents the absolute value of the voltage gradient G and the vertical axis represents the quantity of battery modules M. In the distribution chart, non-defective products are distributed in a region where the absolute value of the voltage gradient is less than 30 V/Ah, and defective products are distributed in a region where the absolute value of the voltage gradient is greater than or equal to 30 V/Ah. The boundary between non-defective products and defective products that is 30 V/Ah is set as an upper limit value Gmax (>0) for the absolute value of the voltage gradient G. When the distribution chart does not include a clear boundary between non-defective products and defective products and includes a region where non-defective products are mixed with defective products, the upper limit value Gmax may be set to the maximum value of the mixed region or to a value in which the number of non-defective products becomes larger than that of defective products in the mixed region.

The controller 11 stores in advance the upper limit value Gmax for the battery modules M, which are subject to determination, in the memory (not shown). The controller 11 calculates the voltage gradient G of a determination subject and compares the absolute value of the voltage gradient G with the predetermined upper limit value Gmax. When the absolute value of the voltage gradient G is less than the upper limit value Gmax, the controller 11 determines that the battery module M subject to determination is a non-defective product. When the absolute value of the voltage gradient G is greater than or equal to the upper limit value Gmax, the controller 11 determines that the battery module M is a defective product.

Operation

The method for determining a micro-short circuit state in the present embodiment will now be described.

First, the battery module M subject to determination is connected to the battery state determination device 10. The connected battery module M, for example, is a battery module M that has not undergone initial charging but has undergone aging. Thus, the SOC of the batter module M is "0" at this stage.

Then, the controller 11 connects the battery module M and the charger to charge the battery module M to a predetermined value (SOC 10%). During the charging, the controller 11 calculates the SOC by cumulating the current values output from the current detection circuit 12. When the cumulated value reaches 10%, a switch or the like that connects the battery module M and the charger is turned off to disconnect the battery module M and the charger.

When supply of current from the charger to the battery module M is stopped, the battery module M is discharged. This decreases the battery voltage. The controller 11 calculates the SOC of the battery module M based on the output value from the current detection circuit 12 and calculates the discharge amount until the SOC falls to 0%. Further, the controller 11 calculates the voltage of the battery module M based on the output value from the voltage detection circuit 13 and stores the voltage in association with the discharge amount.

When the SOC falls to 0%, the controller 11 obtains the absolute value of the voltage gradient G (V/Ah), which is the voltage change amount relative to the discharge amount, from the voltage change amount and discharge amount from the SOC of 10% to 0%. In this calculation, the voltage gradient G may be obtained from the two points of the value when the SOC is 10% and the value when the SOC is 0%. Alternatively, the voltage gradient G may be calculated from the values of three or more points. Subsequently, the controller 11 reads the upper limit value Gmax from the memory and compares the output value of the obtained voltage gradient with the upper limit value Gmax. When the absolute value of the voltage gradient G is less than the upper limit value Gmax, the controller 11 determines that the battery module M is a non-defective product. When the absolute value of the voltage gradient G is greater than or equal to the upper limit value Gmax, the controller 11 determines that the battery module M is in a micro-short circuit state (defective product).

As described above, the first embodiment has the advantages described below.

(1) In the first embodiment, when checking for a micro-short circuit state, the battery state determination device 10 charges the battery module M to a state of charge that is 10% or less and uses the absolute value of the voltage gradient G as a parameter for determination, instead of the voltage. In the battery module M that is in a micro-short circuit state, the absolute value of a voltage gradient in a region where the state of charge is less than 40% is larger than the absolute value of a voltage gradient of a non-defective battery module M. In particular, when the SOC is greater than or equal to 0% and less than or equal to 10%, a battery having a micro-short circuit would have an outstanding abnormality in the voltage gradient G and the absolute value of the voltage gradient G would be substantially constant. Thus, the upper limit value Gmax can be set easily. This improves the determination accuracy. Additionally, since the battery module M only needs to be charged to the SOC of 10% for the determination, the charge time can be shortened.

Second Embodiment

A second embodiment of the present invention will now be described with reference to FIG. 5. The second embodiment differs from the first embodiment only in the procedures of the determination method. Thus, the same reference numerals are given to those components that are the same as the corresponding components of the first embodiment. Such components will not be described in detail.

In the present embodiment, the absolute value of the voltage gradient G of the battery module M is calculated when the SOC is greater than or equal to 0% and less than 40%, and the absolute value of the voltage gradient G is compared with the upper limit value Gmax. The upper limit value Gmax is divided and set for each of an SOC range of 0% or greater to 10% or less and an SOC range of greater than 10% to less than 40%.

Figure 5:
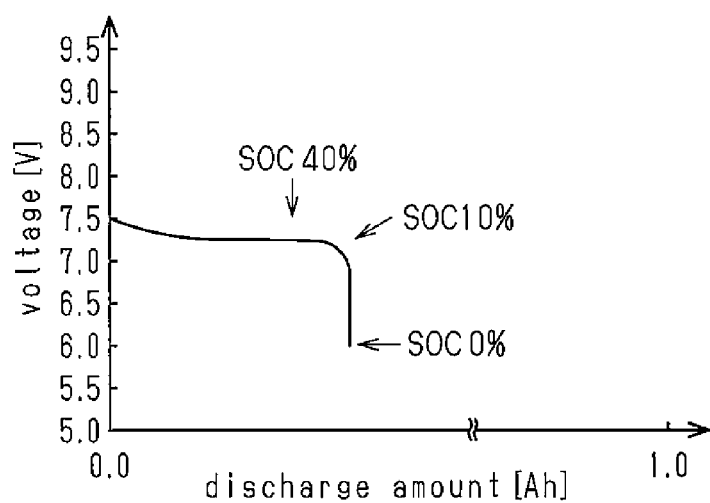
FIG. 5 is a graph showing a second embodiment of a device and method that determines a battery state according to the present invention and showing voltage changes relative to a discharge amount in a defective battery module.

FIG. 5 is a discharge curve of a battery module M in a micro-short circuit state. FIG. 5 is a curve plotted from when the SOC is 100% to when the SOC falls to 0% as a result of discharging. In FIG. 5, the horizontal axis is increased in scale. When the SOC is 10% to 40%, the absolute value of the voltage gradient G resulting from a micro-short circuit is larger than the gradient of the absolute value of the voltage gradient of a non-defective battery module M. The absolute value of the voltage gradient G when the SOC is 10% to 40% is smaller than the absolute value of the voltage gradient G when the SOC is 0% to 10%. Thus, a first upper limit value Gmax1, in which the SOC is in a range that is greater than 10% and less than 40%, and a second upper limit value Gmax2, in which the SOC is in a range that is 0% or greater and 10% or less, are set. The second upper limit value Gmax2 is larger than the first upper limit value Gmax1.

The upper limit values Gmax1 and Gmax2 are each set in the same manner as the first embodiment based on a distribution chart showing the correlation of the voltage gradient G and a micro-short circuit state in which the SOC is 0% or greater and 10% or less and a distribution chart showing the correlation of the voltage gradient G and a micro-short circuit state in which the SOC is 10% or greater and less than 40%. More specifically, the boundary between non-defective products and defective products is obtained in each distribution chart. The boundary for the distribution chart in which the SOC is 0% or greater and 10% or less is set as the second upper limit Gmax2, and the boundary for the distribution chart in which the SOC is 10% or greater and less than 40% is set as the first upper limit Gmax1. When the distribution chart does not include a clear boundary between non-defective products and defective products and includes a region where non-defective products are mixed with defective products, the upper limit value Gmax1 or Gmax2 may be set to the maximum value of the mixed region or to a value in which the number of non-defective products becomes larger than that of defective products in the mixed region.

Operation

The method for determining a micro-short circuit state in the present embodiment will now be described. In the same manner as the first embodiment, a battery module M subject to determination is connected to the battery state determination device 10 prior to initial charging.

Then, the controller 11 connects the battery module M and the charger to charge the battery module M to a predetermined value (SOC 40%). During the charging, the controller 11 calculates the SOC by cumulating the current values output from the current detection circuit 12. When the cumulated value reaches 40%, a switch or the like that connects the battery module M and the charger is turned off to disconnect the battery module M and the charger.

When supply of current from the charger to the battery module M is stopped, the battery module M is discharged. This decreases the battery voltage. The controller 11 calculates the SOC of the battery module M based on the output value from the current detection circuit 12 and calculates the discharge amount. Further, the controller 11 calculates the voltage of the battery module M based on the output value from the voltage detection circuit 13 and stores the voltage in association with the discharge amount.

When the SOC of the battery module M falls to 0%, the controller 11 reads the voltage value corresponding to the discharge amount from the memory. The controller 11 obtains the voltage gradient G (V/Ah), which is the voltage change amount relative to the discharge amount, from the voltage change amount and discharge amount from the SOC of 0% to 10%. The controller 11 also obtains the absolute value of the voltage gradient G (V/Ah), which is the voltage change amount relative to the discharge amount, from the voltage change amount and discharge amount from the SOC of 10% to 40%. Subsequently, the controller 11 reads the first upper limit value Gmax1 and the second upper limit value Gmax2 from the memory, compares the second upper limit value Gmax2 with the absolute value of the voltage gradient G in which the SOC is 0% to 10%, and compares the first upper limit value Gmax1 with the absolute value of the voltage gradient G in which the SOC is 10% to 40%.

When the absolute value of the voltage gradient G relative to the SOC of 0% to 10% is less than the second upper limit value Gmax2 and the absolute value of the voltage gradient G for the SOC of 10% to 40% is less than the first upper limit value Gmax1, the controller 11 determines that the battery module M subject to determination is a non-defective product. When at least one of the condition in which the absolute value of the voltage gradient G for the SOC of 0% to 10% is greater than the second upper limit value Gmax2 and the condition in which the absolute value of the voltage gradient G for the SOC of 10% to 40% is greater than the first upper limit value Gmax1 is satisfied, the controller 11 determines that the battery module M is in a micro-short circuit state.

As described above, the second embodiment has the advantages described below.

(2) In the second embodiment, when checking for a micro-short circuit state, the battery state determination device 10 charges the battery to a state of charge that is less than 40% and uses the absolute value of the voltage gradient G as a parameter for determination, instead of the voltage.

In a battery that is in a micro-short circuit state, the voltage gradient is large in a region where the state of charge is less than 40%. Thus, defective products that are in a micro-short circuit state can be distinguished with high accuracy from non-defective products that are not in a micro-short circuit state by comparing the absolute value of the voltage gradient G with the upper limit value that is obtained in advance through experiments or the like. Since the battery only needs to be charged to the state of charge that is less than 40%, the charging time can be shortened.

(3) In the second embodiment, the upper limit values Gmax1 and Gmax2 for the absolute value of the voltage gradient G are set to different values for the range of 10% to 40% and the range of 0% to 10% that are obtained by dividing the SOC range of less than 40%. The upper limit values Gmax1 and Gmax2 become larger as the SOC decreases. More specifically, the voltage gradient G of a battery module in a micro-short circuit state may change even in the SOC range of less than 40%, and the voltage gradient G increases as the discharge stop voltage becomes closer. Thus, the upper limit values Gmax1 and Gmax2 can be set in accordance with the state of charge even for a battery in which, for example, the voltage gradient rapidly increases at a voltage value that is close to the discharge termination voltage. When comparing the upper limit values Gmax1 and Gmax2 with each voltage gradient G, if an abnormality is not detected when the SOC is 10% to 40% but detected when the SOC is 0% to 10%, the battery module M is determined as being a defective product. This improves the determination accuracy.

Each of the above embodiments may be modified as follows.

In the second embodiment, the upper limit values Gmax1 and Gmax2 are respectively set for the SOC range of 10% to 40% and the SOC range of 0% to 10%. However, the range of the SOC is not limited to these ranges. For example, the upper limit values Gmax1 and Gmax2 may be set to the SOC range of 0% to 20% and the SOC range of 20% to 40%. Further, three or more upper limit values Gmax may be set. For example, an upper limit value may be set for the SOC of 0% to 10%, an upper limit value may be set for the SOC of 10% to 20%, and an upper limit value may be set for the SOC of 20% to 40%.

When determining a micro-short circuit state, the voltage gradient G of the battery module M is obtained when the SOC is less than 40%. The determination is not limited to when the SOC is 0% or greater and 10% or less like in the first embodiment or when the SOC is 0% or greater and less than 40% like in the second embodiment. For example, a micro-short circuit state may be determined when the SOC is 0% or greater and 5% or less, when the SOC is 5% or greater and 10% or less, or when the SOC is 10% or greater and 30% or less.

In each of the above embodiments, the controller 11 includes a CPU, a RAM, and the like. Instead, the controller 11 may include an integrated circuit that includes a voltage detection circuit, a current detection circuit, and the like.

In each of the above embodiments, the method for calculating the cumulated value of the charging current is used as a method for measuring the SOC. Instead, a method for calculating the cumulated value based on other parameters such as the voltage value and the temperature or a method for calculating the cumulated value by combining these parameters including a current value may be used.

In each of the above embodiments, the detrmination subject is the battery module M. However, the determination subject may be changed. For example, an assembled battery including a plurality of battery modules may be subject to determination.

The invention claimed is:

1. A battery state determination device comprising:
   a voltage detector that detects a voltage value of a rechargeable battery that is subject to determination;
   a current detector that detects a current value of the rechargeable battery;
   a charge state detector that detects a state of charge of the rechargeable battery; and
   a determination unit configured to calculate an absolute value of a voltage gradient that indicates a voltage change amount relative to a discharge amount when a state of charge of the rechargeable battery is less than 40%, compare the absolute value of the voltage gradient with a predetermined upper limit value, and determine that a micro-short circuit has occurred in the rechargeable battery when the absolute value of the voltage gradient is larger than the upper limit value.

2. The battery state determination device according to claim 1, wherein the upper limit value of the absolute value of the voltage gradient includes a plurality of upper limit values respectively set for ranges divided from a range in which the state of charge is less than 40%, and the upper limit values are set to be larger as the corresponding state of charge range becomes smaller.

3. The battery state determination device according to claim 1, wherein the determination unit is configured to calculate an absolute value of a voltage gradient that indicates a voltage change amount relative to a discharge amount when the state of charge of the rechargeable battery is in the range of 0% or greater and 10% or less, compare the absolute value of the voltage gradient with a predetermined upper limit value, and determine that a micro-short circuit has occurred in the rechargeable battery when the absolute value of the voltage gradient is larger than the upper limit value.

4. The battery state determination device according to claim 2, wherein the determination unit is configured to calculate an absolute value of a voltage gradient that indicates a voltage change amount relative to a discharge amount when the state of charge of the rechargeable battery is in the range of 0% or greater and 10% or less, compare the absolute value of the voltage gradient with a predetermined upper limit value, and determine that a micro-short circuit has occurred in the rechargeable battery when the absolute value of the voltage gradient is larger than the upper limit value.

* * * * *

UNITED STATES PATENT AND TRADEMARK OFFICE
CERTIFICATE OF CORRECTION

PATENT NO. : 9,880,225 B2
APPLICATION NO. : 14/782778
DATED : October 6, 2015
INVENTOR(S) : Daisuke Koba It is certified that error appears in the above-identified patent and that said Letters Patent is hereby corrected as shown below:

On the Title Page

In Item (73), under "Assignee", in Column 1, Lines 1-2, delete "PRIMEARTH EV ENERGY CO., LTD., Toyota-Shi (JP)" and insert -- PRIMEARTH EV ENERGY CO., LTD., Kosai-shi, Shizuoka (JP); TOYOTA JIDOSHA KABUSHIKI KAISHA, Toyota-shi, Aichi-ken (JP) --, therefor.

Signed and Sealed this
Eleventh Day of December, 2018

Andrei Iancu
*Director of the United States Patent and Trademark Office*